(12) United States Patent
Guernsey

(10) Patent No.: US 11,181,588 B2
(45) Date of Patent: Nov. 23, 2021

(54) SYSTEMS AND METHODS FOR DETECTION AND CONFIGURATION OF SPRAY SYSTEM COMPONENTS

(71) Applicant: Carlisle Fluid Technologies, Inc., Scottsdale, AZ (US)

(72) Inventor: Jonathan Jean Guernsey, Temperance, MI (US)

(73) Assignee: Carlisle Fluid Technologies, Inc., Scottsdale, AZ (US)

( * ) Notice: Subject to any disclaimer, the term of this patent is extended or adjusted under 35 U.S.C. 154(b) by 152 days.

(21) Appl. No.: 16/534,874

(22) Filed: Aug. 7, 2019

(65) Prior Publication Data
US 2020/0049753 A1 Feb. 13, 2020

Related U.S. Application Data

(60) Provisional application No. 62/718,242, filed on Aug. 13, 2018.

(51) Int. Cl.
*G01R 31/60* (2020.01)
*G06F 13/40* (2006.01)

(52) U.S. Cl.
CPC ......... *G01R 31/60* (2020.01); *G06F 13/4068* (2013.01)

(58) Field of Classification Search
None
See application file for complete search history.

(56) References Cited

U.S. PATENT DOCUMENTS

| 5,843,515 A | 12/1998 | Crum et al. |
| 6,363,437 B1 * | 3/2002 | Ptasinski ............... G06F 9/4411 710/10 |
| 7,725,295 B2 | 5/2010 | Stoupis et al. |
| 8,112,568 B1 | 2/2012 | Ely et al. |
| 8,271,693 B2 | 9/2012 | Unuma et al. |
| 9,279,844 B2 | 3/2016 | Aldereguia et al. |
| 9,669,714 B2 | 6/2017 | Schneider |
| 9,772,635 B2 | 9/2017 | Lisboa |

(Continued)

FOREIGN PATENT DOCUMENTS

| DE | 102005010835 A1 | 9/2006 |
| EP | 1084756 A2 | 3/2001 |
| WO | 0007741 A1 | 2/2000 |

OTHER PUBLICATIONS

Adafruit 16-Channel PWM/Servo Hat for Raspberry Pi, Adafruit Learning System, Feb. 3, 2015, https://learn.adafruit.com/adafruit-16-channel-pwm-servo-hat-for-raspberry-pi, 25 pages (Year: 2015).*

(Continued)

*Primary Examiner* — Farley Abad
*Assistant Examiner* — Dayton Lewis-Taylor
(74) *Attorney, Agent, or Firm* — Fletcher Yoder, P.C.

(57) ABSTRACT

Provided are techniques for automatically detecting and configuring a variety of spray system components. The techniques include a controller configured to detect one or more spray system components. The controller is also configured to initialize software drivers corresponding to the spray system components upon connection of the spray system components to the controller. The techniques may provide one or more hardware on top (HAT) boards configured to couple to the controller and the spray system components.

20 Claims, 4 Drawing Sheets

(56) References Cited

U.S. PATENT DOCUMENTS

2010/0203229 A1* 8/2010 Volonte ................ B05B 7/1463
427/8
2017/0216867 A1 8/2017 Mather et al.

OTHER PUBLICATIONS

PCT International Search Report & Written Opinion for PCT Application No. PCT/US2019/046220 dated Nov. 5, 2019, 18 pgs.
Kuther, Margit, So Wird Raspberry Pi 3 Zum Industrie-Controller, Elektronik Praxis, Jul. 18, 2019, https://www.elektronikpraxis.vogel.de/so-wird-raspberry-pi-3-zum-industrie-controller-a-734958/, 5 pages.
Raspberry Pi Sense HAT (Astro-Pi), The Pi Hut, Dec. 12, 2015, https://thepihut.com/products/raspberry-pi-sense-hat-astro-pi, 6 pages.
Plug and Play lot with the Pi Sense HAT, DesignSpark, Sep. 15, 2015, https://www.rs-online.com/designspark/plug-and-play-iot-with-the-pi-sense-hat, 9 pages.

* cited by examiner

SYSTEMS AND METHODS FOR DETECTION AND CONFIGURATION OF SPRAY SYSTEM COMPONENTS

CROSS REFERENCE TO RELATED APPLICATIONS

This application claims priority from and the benefit of U.S. Provisional Application Ser. No. 62/718,242, entitled "SYSTEMS AND METHODS FOR DETECTION AND CONFIGURATION OF SPRAY SYSTEM COMPONENTS," filed Aug. 13, 2018, which is hereby incorporated by reference in its entirety for all purposes.

BACKGROUND

The present disclosure relates generally to systems and methods for the automatic detection and operation of spray equipment components.

This section is intended to introduce the readers to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A number of different spray equipment components may be used in, for example, paint shops or spray service shops. These components may include hand gun applicators, automatic gun applicators, robot-mounted applicators, stand-mounted applicators, rotary atomizers, temperature sensors, humidity sensors, control valves, flow meters, and other components. In many instances, each component must be configured for use with a particular spray system. Manual configuration and reconfiguration of each component for use with different spray systems takes valuable time and resources away from spray system operators. Accordingly, it may be beneficial to provide improved techniques for setup and configuration of spray equipment hardware for use with spray systems.

BRIEF DESCRIPTION

Certain embodiments commensurate in scope with the original claims are summarized below. These embodiments are not intended to limit the scope of the claims, but rather these embodiments are intended only to provide a brief summary of possible forms of the systems and techniques described herein. Indeed, the presently disclosed embodiments may encompass a variety of forms that may be similar to or different from the embodiments set forth below.

In an embodiment, a spray system includes a spray applicator that may operate with a software driver, an additional spray applicator that may operate with an additional software driver, and a controller that may couple to the spray applicators. The controller may automatically detect each spray applicator and initialize the corresponding software driver upon connection of each spray applicator to the controller.

In a second embodiment, a spray system includes a first spray component that may operate with a first software driver, a second spray component that may operate with a second software driver different from the first software driver, a hardware attached on top (HAT) board that may couple to the first spray component and the second spray component, and a controller that may couple to the HAT board. The controller may automatically detect the first spray component via the HAT board and initialize the first software driver upon connection of the first spray component to the HAT board. The controller may also automatically detect the second spray component via the HAT board and initialize the second software driver upon connection of the second spray component to the HAT board.

In a third embodiment, a method of operating a spray system includes automatically detecting, via a processor, a first spray applicator operably coupled to a controller of the spray system and a second spray applicator operably coupled to the controller of the spray system. The method also includes automatically initializing, via the processor, a first software driver upon detecting the first spray applicator and the second software driver upon detecting the second spray applicator. The second software driver is different from the first driver. Further, the method includes controlling, via the processor, a first operation of the first spray applicator and a second operation of the second spray applicator.

DRAWINGS

These and other features, aspects, and advantages of the present disclosure will become better understood when the following detailed description is read with reference to the accompanying drawings in which like characters represent like parts throughout the drawings, wherein.

Figure 3:
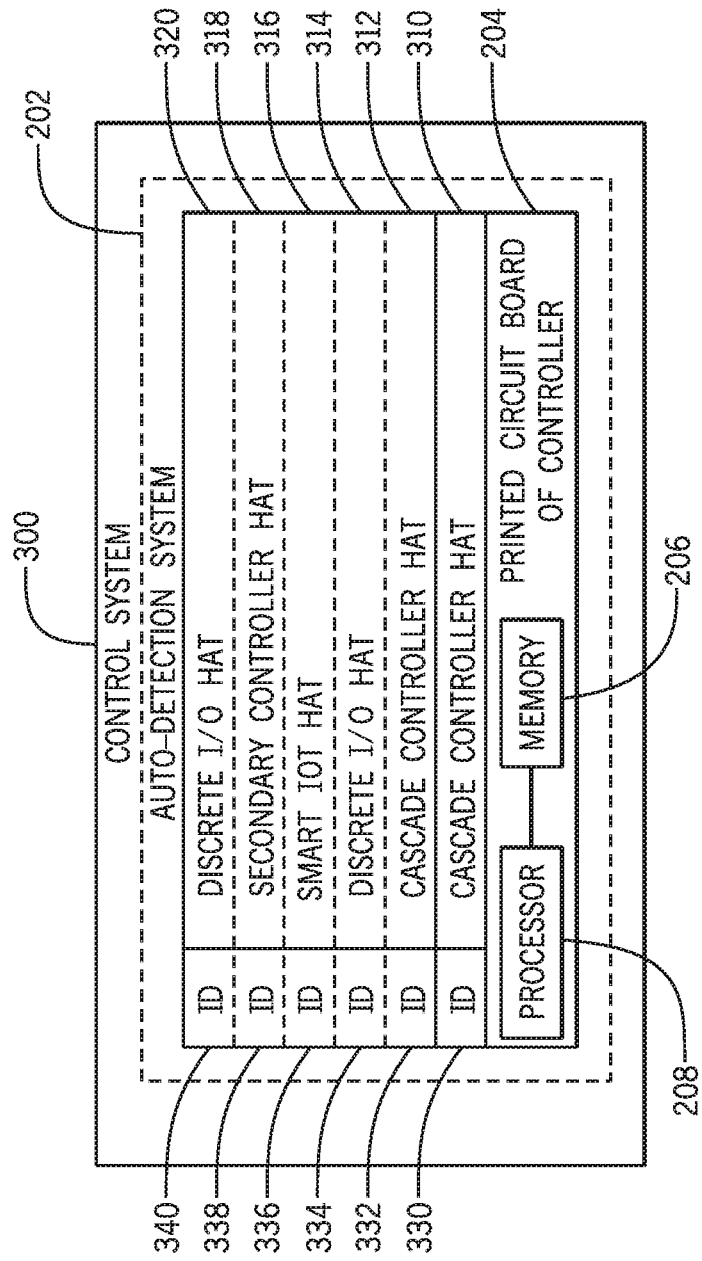
Figure 4:
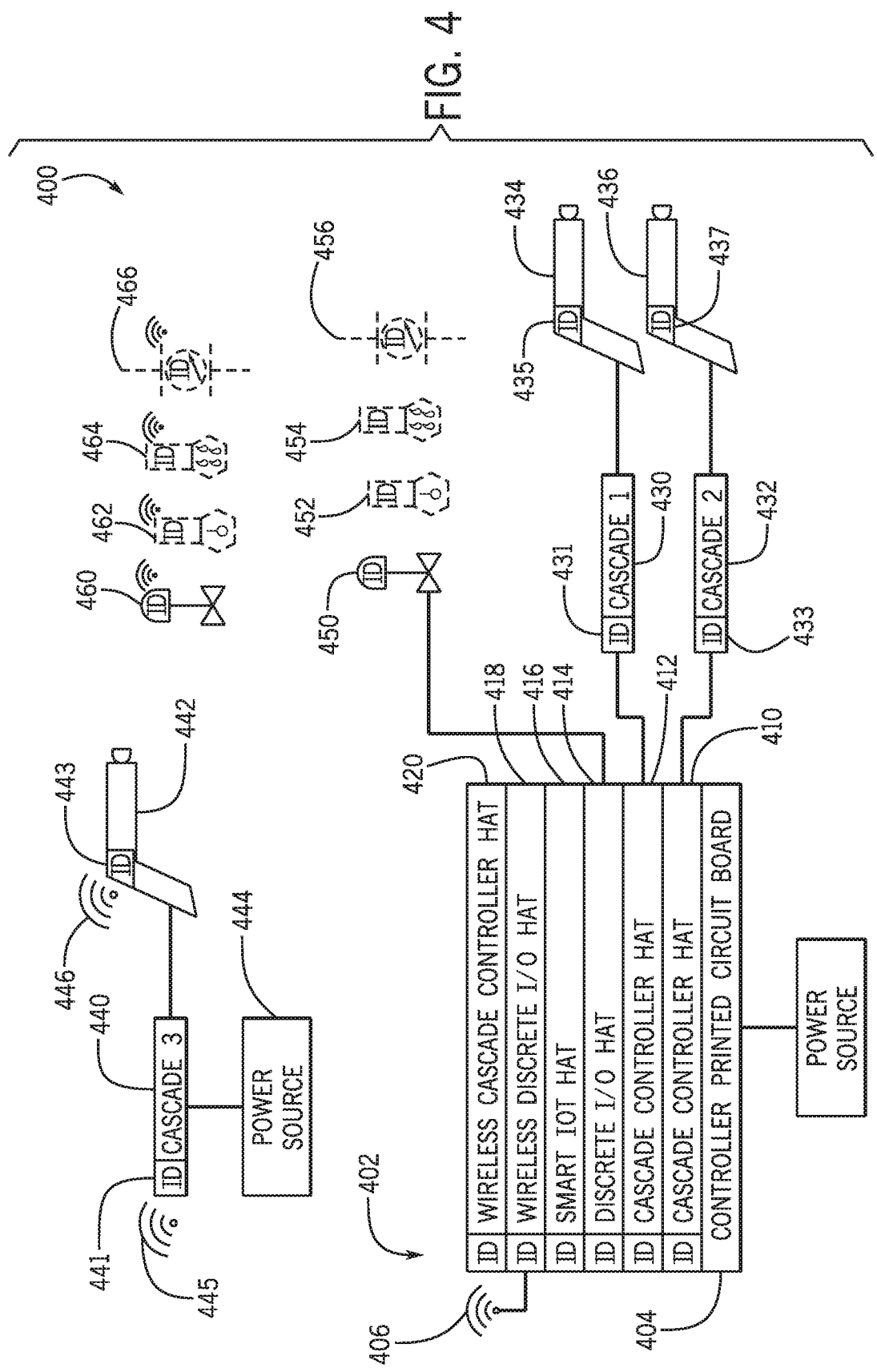

FIG. 3 is a block diagram of an embodiment of a control system configured to utilize various types of HAT boards, in accordance with an aspect of the present disclosure; and FIG. 4 is a block diagram of an embodiment of a spray system utilizing a number of HAT boards configured to automatically detect and configure a number of spray system components for immediate operation, in accordance with an aspect of the present disclosure.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Any examples of operating parameters and/or environmental conditions are not exclusive of other parameters/conditions of the disclosed embodiments.

The following discussion relates to spraying systems and spray components for purposes of illustration; however, implementation of the disclosed techniques is not intended to be limited to spray systems. Indeed, the current techniques may be useful in a number of different contexts. For example, the disclosed embodiments may be used with manufacturing systems that may benefit from the automatic configuration of various components for use with a particular control system.

As discussed in detail below, the disclosed embodiments include techniques for the automatic setup and configuration of spray system components (e.g., spray applicators, cascade voltage multipliers, sensors, and valves) upon detection by a controller of a spray system. A hardware attached on top (HAT) board associated with one or more spray system components is operably coupled to a controller. In one embodiment, the HAT board may couple to the controller such that the controller provides power and functionality to the HAT board. In another embodiment, the HAT board may wirelessly couple to the controller. That is, the HAT board may have its own power source and wirelessly communicate with the controller. The controller identifies the HAT board and any spray system components associated with the HAT board. Upon coupling the spray system component with the HAT board, the controller provides power and functionality to the spray system component without substantial setup or configuration, such that the spray system component is capable of and/or configured for immediate operation. In other words, each spray system component operably coupled to its corresponding HAT board may immediately or substantially immediately power up and perform its function upon detection by the controller (i.e., "plug-and-spray"). For example, a spray applicator may immediately or substantially immediately be capable of spraying material upon detection by the controller. Additionally, once a spray system component is uncoupled from a particular spray system, the spray system component may automatically be reconfigured upon coupling with the same spray system or a different spray system.

Figure 1:
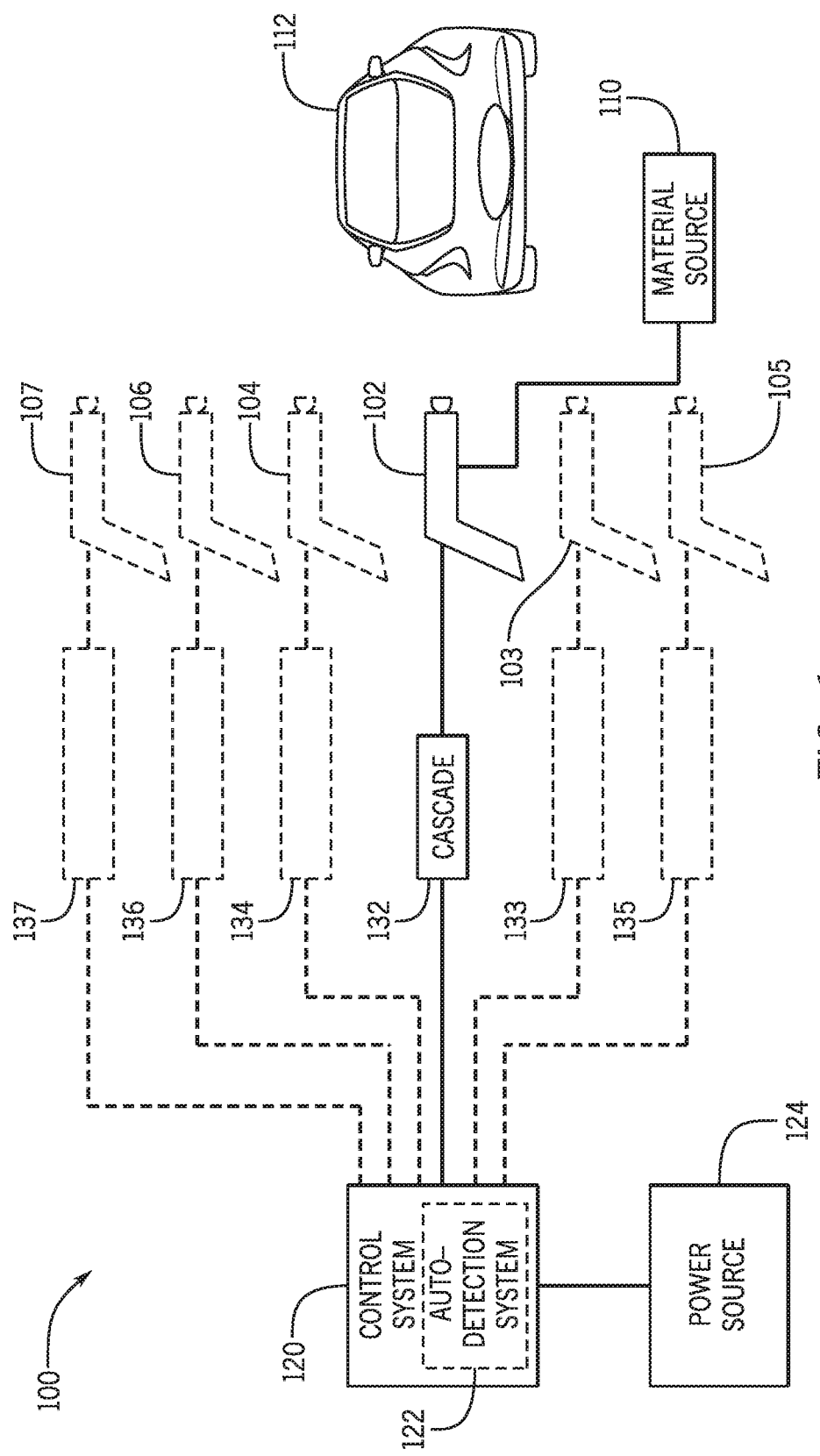
FIG. 1 is a block diagram of an embodiment of a spray system configured to automatically detect and configure a number of spray applicators for immediate operation, in accordance with an aspect of the present disclosure.

With the foregoing in mind, FIG. 1 is a block diagram of an embodiment of a spray system 100 configured to automatically detect and configure a spray applicator 102 for immediate or substantially immediate operation. As used herein, "immediate operation" refers to the capability of a spray system component to perform its function upon detection by a control system (e.g., controller) without substantial setup or configuration. Spray applicator 102 may be coupled to material source 110 (e.g., paint mixer and/or supply system) via a hose or conduit. Spray applicator 102 may receive material (e.g., foam, fluid, or powder) from material source 110 and spray the material towards a car 112 or other object to be coated with the material. Power source 124 may supply power to cascade voltage multiplier 132 via control system 120. Cascade voltage multiplier 132 may then supply power to spray applicator 102 when spray applicator 102 is coupled to control system 120. In certain embodiments, power source 124 may supply power to cascade voltage multiplier 132 as an alternating current. Cascade voltage multiplier 132 may supply power to spray applicator 102 based on the operational specifications of spray applicator 102. In some embodiments, the cascade voltage multiplier 132 may supply power with a voltage up to 65 kV to spray applicator 102.

Control system 120 may have one or more electronic components that may be powered by the power source 124. Control system 120 may separately or jointly include a processor, memory, and software code or instructions stored on the memory and executable by the processor to perform various control functions as discussed in detail below. Control system 120 may include an auto-detection system 122 that may detect cascade voltage multiplier 132 when cascade voltage multiplier 132 is operably coupled to control system 120. Auto-detection system 122 may determine an identifier of the coupled cascade voltage multiplier 132. As used herein, the term "identifier" may refer to identifying code, identifying signal(s), identification data, or a combination thereof. Based on the identifier of the coupled cascade voltage multiplier 132, auto-detection system 122 may determine an identifier of a corresponding spray applicator 102 from data related to one or more spray applicators stored in the memory of control system 120. Additionally, control system 120 may access operational data and/or one or more software drivers associated with the cascade voltage multiplier 132 or the spray applicator 102 in the memory of control system 120. Control system 120 may then automatically configure the operation of either the cascade voltage multiplier 132 or the spray applicator 102 based on the operational data and/or one or more software drivers.

In some embodiments, control system 120 may determine if use of either cascade voltage multiplier 132 or spray applicator 102 is supported by control system 120 based on the operational data. For example, if a higher voltage cascade multiplier is operably coupled to a lower voltage controller (e.g., of control system), the controller may detect the identity of the higher voltage cascade multiplier but provide an audible or visible indication that the controller is incompatible with the higher voltage cascade multiplier. However, if the controller determines that the cascade voltage multiplier 132 and the spray applicator are supported by the control system 120, the control system 120 may initialize one or more software drivers to permit the cascade voltage multiplier 132 and the spray applicator 102 to function or operate together.

In some embodiments, the controller may determine the mode of operation of the spray applicator 102 based on the operational data or one or more software drivers. For example, the control system 120 may use the operational data or the one or more software drivers to determine whether the spray applicator 102 operates in a current controlled state or voltage controlled state. In embodiments where the material output of the spray applicator 102 is a liquid, the cascade voltage multiplier 132 may operate in a voltage-controlled state. In other words, the output from the power source 124 may be converted to a voltage, and the cascade voltage multiplier 132 may be controlled by the amount of voltage supplied thereto. However, in some embodiments, the spray applicator 102 may operate in a current controlled state. Where the material output of the spray applicator 102 is a solid particulate material (e.g., powder), the cascade voltage multiplier 132 may operate in a current controlled state. In other words, the output from the power source 124 may be converted to a controlled current that may be adjusted to alter operation of the spray applicator 102.

While the illustrated embodiment includes one spray applicator 102 and one corresponding cascade voltage multiplier 132 operably coupled to control system 120 (as depicted by the solid lines in FIG. 1), in some embodiments, there may be more than one spray applicator 102 and more than one cascade voltage multiplier 132 operably coupled to control system 120. For example, a second spray applicator 103, a third spray applicator 104, a fourth spray applicator 105, a fifth spray applicator 106, and/or a sixth spray applicator 107 and a second cascade voltage multiplier 133, a third cascade voltage multiplier 134, a fourth cascade voltage multiplier 135, a fifth cascade voltage multiplier 136, and/or a sixth cascade voltage multiplier 137 may be operably coupled to control system 120 (as depicted by the dotted lines).

Figure 2:
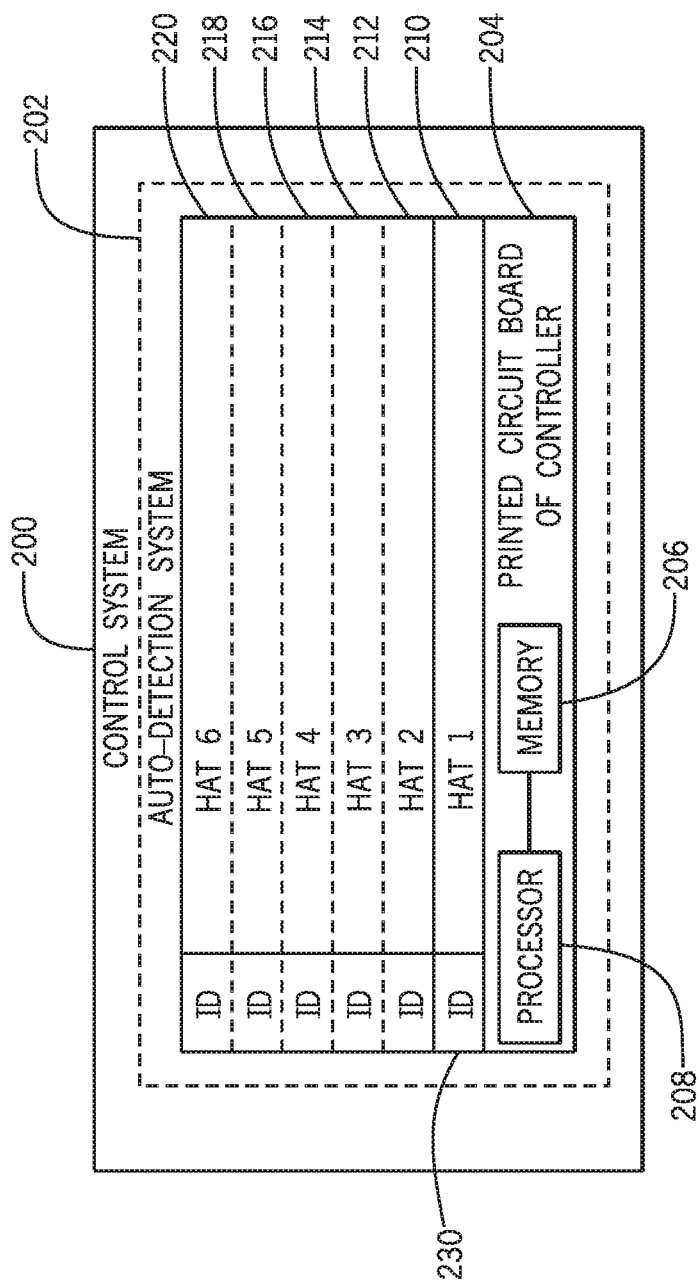
FIG. 2 is a block diagram of an embodiment of a control system configured to utilize a number of hardware attached on top (HAT) boards, in accordance with an aspect of the present disclosure.

FIG. 2 is a block diagram of an embodiment of a control system 200 that includes an auto-detection system 202 configured to utilize a number of hardware attached on top (HAT) boards 210, 212, 214, 216, 218, 220. A HAT board (e.g., 210) is an add-on board that upon interfacing with the hardware of a controller (e.g., 204) enables the controller to identify any hardware (e.g., spray system components) coupled to the HAT board. A HAT board may also provide additional functionality to the controller. In some embodiments, the HAT board may include a printed circuit board (PCB) that has mounting holes that align with mounting holes of a PCB of the controller. The HAT board and PCB of the controller may be coupled using any suitable fastener (e.g., screw, clip, nail, or pin) and the aligned mounting holes. Additionally, a general purpose input/output (GPIO) header of the HAT board 210 may mate with a GPIO connector of the PCB of the controller 204. In some embodiments, the GPIO connector includes 8 pins, 26 pins, 40 pins, or more pins.

In certain embodiments, the controller 204 is an electronic controller having electrical circuitry configured to process data from particular components of a spray system and operate particular components of the spray system. In the illustrated embodiment, the controller 204 includes a processor 208 and a memory device 206. The processor 208 may be used to execute software, such as software for providing commands and/or data to the controller 204, and so forth. Moreover, the processor 208 may include multiple microprocessors, one or more "general-purpose" microprocessors, one or more special-purpose microprocessors, and/or one or more application specific integrated circuits (ASICS), or some combination thereof. For example, the processor 208 may include one or more reduced instruction set (RISC) processors. The memory device 206 may include a volatile memory, such as RAM, and/or a nonvolatile memory, such as ROM. The memory device 206 may store a variety of information and may be used for various purposes. For example, the memory device 206 may store processor-executable instructions (e.g., firmware or software) for the processor 208 to execute, such as instructions for providing commands and/or data to the controller 204.

When HAT board 210 is operably coupled to the PCB of controller 204, controller 204 may automatically detect and identify the HAT board 210. Upon detection and identification of the HAT board 210, controller 204 may configure the GPIO connector of controller 204 to communicate with and provide power and functionality to HAT board 210. Additionally, controller 204 may automatically install one or more software drivers in memory 206 of controller 204 based on the identified HAT board 210 operably coupled to the PCB of controller 204. The one or more software drivers may correspond to one or more spray system components associated with HAT board 210. Controller 204 may also reconfigure the hardware interface of the identified HAT board 210 to communicate and provide power and/or functionality to any spray system components associated with HAT board 210. In some embodiments, the operably coupled HAT board 210 may be an intelligent HAT board 210. In this case, upon detection and identification of the HAT board 210 by controller 204, the intelligent HAT board 210 may reconfigure its own hardware interface to communicate with controller 204 and/or any spray system components associated with HAT board 210. Thus, by coupling a spray system component (not depicted in FIG. 2) to a corresponding HAT board, the controller 204 may automatically initialize one or more software drivers to permit the spray system component to operate immediately or substantially immediately without substantial setup or configuration. In some embodiments, the one or more software drivers may be updated in memory 206 of controller 204 via a wired or wireless network or a communications system.

HAT board 210 may also include an identification data (ID) associated with HAT board 210 (e.g., vendor information or board manufacturer information). Controller 204 may utilize this data to identify HAT board 210 and determine one or more spray system components compatible with HAT board 210. For example, controller 204 may access the identification data from an electrically erasable programmable read only memory (EEPROM) of HAT board 210. In some embodiments, the identification data of the HAT board 210 may be stored on other types of read only memory, flash memory, or any other suitable data storage device. In some embodiments, the identification data of the HAT board 210 may be accessed via radio-frequency identification (RFID) tags, barcodes, optical identification codes, or any other suitable technique. ID 230 may also include a GPIO map that provides instructions to HAT board 210 for configuring the GPIO connector of controller 204 to provide power and/or functionality to one or more spray equipment components. Further, ID 230 may include a device tree or a device tree fragment that allows controller 204 to automatically load one or more software drivers from memory 206 of controller 204 that supports the functionality of the spray equipment components coupled to HAT board 210. Controller 204 may then apply logic based on the loaded drivers to provide power and/or functionality to the spray equipment components. In some embodiments, controller 204 may direct power from a power source directly to HAT board 210 if, for example, the amount of supplied power exceeds the limitations of controller 204. As such, ID 230 allows controller 204 to identify any coupled HAT boards and automatically configure any coupled spray system components for immediate operation.

While the illustrated embodiment includes one HAT board 210 coupled to control system 200 (as depicted by the solid line in FIG. 2), in some embodiments, there may be more than one HAT board coupled to control system 200. For example, a second HAT board 212, a third HAT board 214, a fourth HAT board 216, a fifth HAT board 218, and/or a sixth HAT board 220 (as depicted by the dotted lines) may be stacked (e.g., coupled to the control system) to configure control system 204 to automatically detect 2, 3, 4, 5, 6, or more spray system components. The HAT boards may be stacked using a stacking header coupled to the GPIO controller of the controller PCB and the stacking header of each additional HAT board.

FIG. 3 is a block diagram of an embodiment of the control system 300 including an auto-detection system 202 utilizing various types of HAT boards. As described above with reference to FIG. 2, controller 204 may include a processor 208 and a memory device 206. In some embodiments, 1, 2, 3, 4, or more types of HAT boards may be coupled to the PCB of controller 204. Controller 204 may automatically determine (e.g., via an auto-detection system) the identity of each HAT board coupled to the PCB of the controller 204 based on the ID 330, 332, 334, 336, 338, 340 of each HAT board and install one or more software drivers into memory 206 of controller 204. For example, controller 204 may determine that a cascade controller HAT board 310, 312, a discrete input/output HAT board 314, 320, a smart internet-of-things (IOT) HAT board 314, and a secondary controller HAT board 316 are coupled to the PCB of controller 204.

Controller 204 may also communicate with any coupled spray system components (not depicted) via each corresponding coupled HAT board. In certain embodiments, upon detecting and identifying a coupled cascade controller HAT board 310, 312, controller 204 may reconfigure the hardware interface of coupled cascade controller HAT board 310, 312 to communicate with and provide power and/or functionality to a cascade voltage multiplier operably coupled via cascade controller HAT board 310, 312. Upon detection of cascade voltage multiplier via the coupled cascade controller HAT board 310, 312, controller 204 may determine the identity of the cascade voltage multiplier based on an identifier of the cascade voltage multiplier. The identifier of the cascade voltage multiplier may include identification data associated with the cascade voltage multiplier (e.g., merchant or vendor information) and the operational specification or data related to the cascade voltage multiplier. In some embodiments, the ID 330, 332 of cascade controller HAT board 310, 312, may provide the operational specification of the cascade voltage multiplier. Controller 204 may also determine the compatibility of the cascade voltage multiplier with controller 204 by comparing the operational specification of the cascade voltage multiplier to the operational specification of controller 204. In some embodiments, if controller 204 is not compatible with the cascade voltage multiplier, controller 204 may provide an audible or visible indication of the incompatibility of the cascade voltage multiplier.

In some embodiments, if controller 204 is compatible with the cascade voltage multiplier (and the cascade voltage multiplier is operably coupled to a corresponding cascade controller HAT board 310, 312), controller 204 may load one or more software drivers for the cascade voltage multiplier from memory 206 of controller 204. Based on the one or more software drivers, controller 204 may identify other spray system components that are coupled to the cascade voltage multiplier. For example, controller 204 may identify a spray applicator (e.g., spray gun) coupled to the cascade voltage multiplier. Controller 204 may also determine if a coupled spray system component is compatible with the cascade voltage multiplier. In some embodiments, if the spray system component is not compatible with the cascade voltage multiplier, controller 204 may provide an audible or visible indication of the incompatibility of the spray system component and/or cascade voltage multiplier. In some embodiments, if the spray system component is compatible with the cascade voltage multiplier, controller 204 may apply logic based on the one or more loaded software drivers to provide power and/or functionality to the spray equipment component. For example, controller 204 may adjust the voltage supplied to a spray applicator via the cascade voltage multiplier such that the spray applicator receives power within the operational limitations of the spray applicator and/or the cascade voltage multiplier.

In certain embodiments, upon detecting and identifying a discrete input/output (I/O) HAT board 314, 320, controller 204 may reconfigure the hardware interface of coupled discrete I/O HAT board 314, 320 to communicate with and provide power and/or functionality to one or more I/O devices (not depicted) operably coupled to discrete I/O HAT board 314, 320. In certain embodiments, discrete I/O HAT board 314, 320 may be coupled to add functionality to controller 204, or to accommodate additional process features. Upon detection of an I/O device via the coupled discrete I/O HAT board, controller 204 may determine the identity of the I/O device based on an identifier of the I/O device. The identifier may include identification data associated with the I/O device (e.g., merchant and or vendor information) and the operational specification or data related to the I/O device. For example, controller 204 may determine that the I/O device is a pulsing device, a counting device, a temperature sensor, a humidity sensor, a solenoid valve, a proportional valve, or any other type of sensor or control hardware in a spray system. In some embodiments, the ID 334, 340 of the discrete I/O HAT board 314, 320, may provide the operational specification of the I/O device. Controller 204 may also determine the compatibility of the I/O device with controller 204 by comparing the operational specification of the I/O device to the operational specification of controller 204. In some embodiments, if controller 204 determines that controller 204 is not compatible with the I/O device, controller 204 may provide an audible or visible indication of the incompatibility of the cascade voltage multiplier. If controller 204 determines that controller 204 is compatible with the I/O device, controller 204 may load one or more software drivers for the I/O device from memory 206 of controller 204. Controller 204 may then apply logic based on the one or more loaded software drivers to provide power and/or functionality to the I/O device.

In certain embodiments, upon detecting and identifying a smart IOT HAT board 316, controller 204 may configure controller 204 and/or the smart IOT HAT board 316 to receive external data related to a spray system via a wired or wireless network and control spray system components coupled to controller 204 based on the data received. Additionally, the controller 204 may configure controller 204 to send data acquired by controller 204 (e.g., via the I/O devices) to a computing device or a cloud-based computing system. The computing device may be a computing device that includes communication abilities, processing abilities, and the like. For example, the computing device may be any general computing device that may monitor, control, and/or operate the spray system or components of the spray system. As such, the computing device may be a laptop computer, a tablet computer, a mobile phone device computing device, a general personal computer, a wearable computing device, or the like. The cloud-based computing system may be a cloud-accessible platform that may include one or more servers, one or more computing devices (e.g., general-purpose computers), and the like. In any case, the cloud-based computing system may include a number of computers that may be connected through a real-time communication network, such as the Internet, Ethernet, EtherNet/IP, ControlNet, DeviceNet, or any other communication protocol, such that the multiple computers may operate together as a single entity. Alternatively, the computers of the cloud-based computing system may communicate via various wired or wireless communication protocols, such as Wi-Fi, mobile telecommunications technology (e.g., 2G, 3G, 4G, LTE), Bluetooth®, near-field communications technology, and the like. The real-time communication network may include any network that enables various devices to communicate with each other at near real-time or such that data is communicated with each other at near instantaneous speeds. In one embodiment, the cloud-based computing system may be capable of communicating with controller 204 and/or the spray system components. As such, the cloud-based computing system may be capable of wired or wireless communication between controller 204 and the spray system components. In one embodiment, the cloud-based computing system may be accessible via the Internet or some other network.

In certain embodiments, upon detecting and identifying a secondary controller HAT board 318, controller 204 may configure controller 204 to relinquish control of certain characteristics of a coupled spray system component to secondary controller HAT board 318. For example, secondary controller HAT board 318 may control characteristics of the supplied electrical power to a spray system component. Secondary controller HAT board 318 may increase or decrease the voltage output. Thus, secondary controller HAT board 318 may provide independent control of certain characteristics of a coupled spray system component.

In some embodiments, two or more spray system components may be coupled to a single HAT board. Thus, upon detecting and identifying the HAT board coupled to the spray system components, the controller may configure the HAT board to provide power and/or functionality to two or more spray system components. For example, the discrete I/O HAT board 314, 320 may be coupled to two sensors in a spray system. In some embodiments, a single HAT board may be coupled to up to 256 spray system components.

The controller, the spray system components, and the corresponding HAT boards may also include a communication component that enables the spray system components and the controller (e.g., directly or indirectly via the HAT boards) to communicate data between each other and other devices. The communication components may include a network interface that enables the spray system components and the controller to communicate via various protocols such as EtherNet/IP, ControlNet, DeviceNet, or any other communication network protocol. Alternatively, the communication component may enable the controller, the spray system components, and the HAT boards to communicate via various wired or wireless communication protocols such as Wi-Fi, mobile telecommunications technology (e.g., 2G, 3G, 4G, LTE), Bluetooth®, near-field communications technology, and the like. As such, the spray system components may be wirelessly coupled to the controller via the HAT boards.

While the illustrated embodiment includes one type 310 of HAT board coupled to the PCB of controller 204 (as depicted by the solid line), in some embodiments, there may be more than one type of HAT board coupled to the PCB of controller 204. For example, a second type 314, a third type 316, a fourth type 318, or additional types of HAT boards may be stacked to configure the control system to automatically detect 2, 3, 4, or more spray system components. Additionally, one or more HAT boards of each type of HAT board may be coupled to the PCB of controller 204. For example, two cascade voltage multiplier HAT boards 310, 312, a SMART I/O HAT board 316, a secondary controller HAT board 318, and two discrete I/O HAT boards 314, 320 may be coupled to the PCB of controller 204. The HAT boards may be stacked using a stacking header installed in the GPIO pins of the controller PCB and each HAT board.

FIG. 4 is a block diagram of an embodiment of a control system 402 utilizing a number of HAT boards for the automatic detection and configuration of a number of spray equipment components within a spray system 400. Controller 404 may be coupled to a first cascade controller HAT board 410, a second cascade controller board 412, a discrete I/O HAT board 414, a smart IOT HAT board 416, a wireless discrete I/O HAT board 418, and a wireless cascade controller HAT board 420. While the illustrated embodiment includes the types of HAT boards listed above, in some embodiments, there may be different types of HAT boards and/or different combinations of HAT boards coupled to the PCB of controller 404.

As illustrated in FIG. 4, a first cascade controller HAT board 412 and a second cascade controller HAT board 410 are coupled (e.g., via a low voltage cable with an identification interface) to cascade voltage multiplier 430 and cascade voltage multiplier 432, respectively. As described above, upon detection of cascade controller HAT boards 410, 412 by controller 404, controller 404 may reconfigure the hardware interface of coupled cascade controller HAT boards 410, 412 to communicate with and provide power and/or functionality to corresponding cascade voltage multipliers 430, 432. In some embodiments, controller 404 may configure cascade controller HAT boards 410, 412 at the same time upon detection by controller 404 or at different times (e.g., subsequently or sequentially) upon detection by controller 404. Additionally, upon identifying and detecting coupled cascade controller HAT boards 410, 412, controller 404 may automatically install one or more software drivers into the memory of controller 404. Controller 404 may then determine the identity of coupled cascade voltage multipliers 430, 432 based on identifiers 431, 432 of each cascade voltage multiplier 430, 432. Next, controller 404 may determine the compatibility of each cascade voltage multiplier 430, 432 with controller 404. If controller 404 is not compatible with either cascade voltage multiplier 430, 432, controller 404 may provide an audible or visible indication of the incompatibility of either cascade voltage multiplier 430, 432. If controller 404 is compatible with either or both of cascade voltage multiplier 430, 432, controller 404 may load one or more software drivers for each compatible cascade voltage multiplier from the memory of controller 404. Based on the one or more software drivers for each cascade voltage multiplier 430, 432, controller 404 may identify corresponding spray applicators 434, 436 coupled to each cascade voltage multiplier 430, 432, respectively. For example, controller 404 may identify a rotary atomizer 434 coupled to cascade voltage multiplier 430 and a powder gun 436 coupled to cascade voltage multiplier 432. Controller 404 may also determine if spray applicators 434, 436 are compatible with their corresponding cascade voltage multipliers 430, 432 based on identifier 435, 437 of each spray applicator 434, 436, respectively. In some embodiments, if a spray applicator 434, 436 is not compatible with a cascade voltage multiplier 430, 432, controller 404 may provide an audible or visible indication of the incompatibility of the spray applicator. In some embodiments, if the spray applicator 434, 436 is compatible with cascade voltage multiplier 430, 432, controller 404 may apply logic based on the one or more loaded one or more software drivers to provide power (e.g., via the cascade voltage multiplier) and/or functionality to the spray applicator 434, 436.

In some embodiments, the cascade voltage multiplier and/or the spray applicator are coupled to controller 404 wirelessly (e.g., via Wi-Fi, Bluetooth, or other wireless communication protocols). Cascade voltage multiplier 440, spray applicator 442, and wireless cascade controller HAT board 420 may include a communication component 406, 445, 446 that enables cascade voltage multiplier 440, spray applicator 442, and controller 404 to communicate data (e.g., via wireless cascade controller HAT) between each other and other devices. For example, wireless cascade controller HAT board 420 may configure controller 404 to wirelessly detect cascade voltage multiplier 440. Controller 404 may scan the environment of spray system 400 for the identifier 441 of cascade voltage multiplier 440. Upon detection of cascade voltage multiplier 440, controller 404 may load one or more software drivers for cascade voltage multiplier 440 from the memory of controller 404. Based on the one or more software drivers, controller 404 may communicate with cascade voltage multiplier 440 to detect spray applicator 442 via a direct connection (e.g., cable) between cascade voltage multiplier 440 and spray applicator 442.

In some embodiments, controller 404 may directly detect spray applicator 442 wirelessly. Controller 404 may determine identifier 443 of spray applicator 442 based on identifier 441 of cascade voltage multiplier 440. Controller 404 may access data associated with identifier 441 of cascade voltage multiplier 440 stored in the memory of controller 404. Controller 404 may determine one or more identifiers from the data that correspond to spray applicators that may couple to the cascade voltage multiplier. Controller 404 may then scan the environment of the spray system 400 for the one or more identifiers. Upon detection of an identifier 443, controller 404 may communicate directly with the corresponding spray applicator 442. Once controller 404 determines that spray applicator 442 is compatible with cascade voltage multiplier 440, controller 404 may wirelessly provide functionality to spray applicator 442. For example, controller 404 may send a command to cascade voltage multiplier 440 to supply power from power source 444 to spray applicator 442. In another example, controller 404 may send a command to spray applicator 442 to adjust operation of spray applicator 442 (e.g., turn the spray applicator on or off).

Additionally, upon detection of discrete I/O HAT board 414 by controller 404, controller 404 may reconfigure the hardware interface of discrete I/O HAT board to communicate with and provide power and/or functionality to one or more I/O devices 450, 452, 454, 456 operably coupled via discrete I/O HAT board 414. While the illustrated embodiment includes a valve 450 directly coupled to discrete I/O HAT board via a cable, in some embodiments, there may be more than one type of I/O device coupled to discrete I/O HAT board and/or more than one of each type of I/O device coupled to discrete I/O HAT board. For example, a valve 450, a temperature sensor 452, a humidity sensor 454, and a flow meter 456 may be coupled to discrete I/O HAT board. In some embodiments, the I/O devices may be in any suitable location throughout the environment of the spray system 400. In some embodiments, discrete I/O HAT board 414 may configure the controller to detect two or more I/O devices at the same time or at different times.

Controller 404 may determine the identity of the I/O device based on an identifier of the input device or an identifier of the output device. The controller 404 may also determine whether the I/O device is compatible with controller 404 based on the identifier of the I/O device. Upon determining that controller 404 is compatible with the I/O device, controller 404 may load one or more software drivers for the I/O device from the memory of controller 404. Controller 404 may then apply logic based on the one or more loaded software drivers to provide power and/or functionality to the I/O device.

In some embodiments, the I/O device is coupled to controller 404 wirelessly (e.g., via Wi-Fi, Bluetooth, or other wireless communication protocols). I/O device 460, wireless discrete I/O HAT board 418, and controller 404 may include a communication component that enables I/O device 460, and controller 404 to communicate data (e.g., via wireless discrete I/O HAT board 418) between each other and other devices. For example, wireless discrete I/O HAT board may configure controller 404 to wirelessly detect I/O device 460. Controller 404 may then scan the environment of spray system 400 for identifiers of I/O devices that may wirelessly couple to controller 404. Upon detection of I/O device 460, controller 404 may load one or more software drivers for I/O device 460 from the memory of controller 404. Based on the one or more software drivers, controller 404 may communicate with I/O device 460 to provide functionality to I/O device 460. For example, controller 404 may send a command to valve 460 to open or close. In another example, controller 404 may receive temperature data from temperature sensor 460.

While the illustrated embodiment includes one I/O device 460 wirelessly coupled to controller 404, in some embodiments, there may be more than one I/O device wirelessly coupled to controller 404. In some embodiments, up to 256 I/O devices may be coupled to controller 404 via wireless discrete I/O HAT board.

Further, upon detection of smart IOT HAT board 416 by controller 404, controller 404 may configure controller 404 to receive external data related to spray system 400 via a wired or wireless network and control components of the spray system coupled to controller 404 based on the data received. The controller 404 may also configure controller 404 to send data acquired by controller 404 (e.g., via the I/O devices) to a computing device or a cloud-based computing system.

This written description uses examples, including the best mode, to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

While only certain features of the present disclosure have been illustrated and described herein, many modifications and changes will occur to those skilled in the art. It is, therefore, to be understood that the appended claims are intended to cover all such modifications and changes as fall within the true spirit of the present disclosure.

The invention claimed is:

1. A spray system, comprising:

a first spray applicator configured to operate with a first software driver;

a second spray applicator configured to operate with a second software driver different from the first software driver;

a first cascade voltage multiplier configured to operate with a third software driver; and a controller configured to operably couple to the first cascade voltage multiplier, the first spray applicator, and the second spray applicator, wherein the controller is configured to automatically detect the first cascade voltage multiplier and initialize the third software driver upon connection of the first cascade voltage multiplier to the controller, wherein the controller is configured to automatically detect the first spray applicator and initialize the first software driver upon connection of the first spray applicator to the first cascade voltage multiplier, and wherein the controller is configured to automatically detect the second spray applicator and initialize the second software driver upon connection of the second spray applicator to the controller.

2. The spray system of claim 1, comprising:
a second cascade voltage multiplier configured to operate with a fourth software driver different from the third software driver;
wherein the controller is configured to operably couple to the second cascade voltage multiplier, and the second cascade voltage multiplier is configured to couple to the second spray applicator, and wherein the controller is configured to automatically detect the second cascade voltage multiplier and initialize the fourth software driver upon connection of the second cascade voltage multiplier to the controller.

3. The spray system of claim 1, wherein the controller comprises a printed circuit board and a plurality of hardware attached on top (HAT) boards coupled to the printed circuit board.

4. The spray system of claim 3, wherein a first HAT board of the plurality of HAT boards is configured to couple to the first spray applicator, the second spray applicator, or both.

5. The spray system of claim 3, wherein the plurality of HAT boards comprises six HAT boards.

6. The spray system of claim 3, wherein at least one HAT board of the plurality of HAT boards comprises a discrete input/output (I/O) HAT board.

7. The spray system of claim 6, comprising a sensor configured to couple to the discrete I/O HAT board, wherein the sensor comprises a temperature sensor, a humidity sensor, a motor feedback sensor, a flow meter, or any combination thereof.

8. The spray system of claim 7, wherein the controller is configured to initialize a corresponding software driver from a memory of the controller based on the sensor coupled to the discrete I/O HAT board.

9. The spray system of claim 1, wherein the first spray applicator comprises a powder gun, and the second spray applicator comprises a rotary atomizer.

10. The spray system of claim 1, wherein the controller comprises a memory, and the first software driver and the second software driver are stored on the memory.

11. A spray system, comprising:
a spray applicator configured to operate with a first software driver;
a cascade voltage multiplier configured to operate with a second software driver different from the first software driver;
a hardware attached on top (HAT) board configured to couple to the spray applicator, the cascade voltage multiplier, or both; and
a controller configured to couple to the HAT board, wherein the controller is configured to automatically detect the cascade voltage multiplier via the HAT board and initialize the second software driver upon the cascade voltage multiplier being communicatively connected to the HAT board, and wherein the controller is configured to automatically detect the spray applicator via the HAT board and initialize the first software driver upon the spray applicator being communicatively connected to the HAT board.

12. A method of operating a spray system, comprising:
automatically detecting, via a processor, a first cascade voltage multiplier operably coupled to a controller of the spray system;
automatically detecting, via the processor, a first spray applicator operably coupled to the controller of the spray system;
automatically detecting, via the processor, a second spray applicator operably coupled to the controller of the spray system;
automatically initializing, via the processor, a first software driver upon detecting the first cascade voltage multiplier;
automatically initializing, via the processor, a second software driver upon detecting the first spray applicator;
automatically initializing, via the processor, a third software driver upon detecting the second spray applicator, wherein the third software driver is different from the second software driver;
controlling, via the processor, a first operation of the first spray applicator; and
controlling, via the processor, a second operation of the second spray applicator.

13. The method of claim 12, comprising:
automatically detecting, via the processor, a second cascade voltage multiplier operably coupled to the controller of the spray system; and
automatically initializing, via the processor, a fourth software driver upon detecting the second cascade voltage multiplier, wherein the fourth software driver is different from the first software driver.

14. The method of claim 13, comprising:
determining that the controller is incompatible with the first cascade voltage multiplier, the second cascade voltage multiplier, or both; and
providing an indication of the incompatibility of the first cascade voltage multiplier, the second cascade voltage multiplier, or both.

15. The method of claim 12, wherein the first spray applicator and the second spray applicator are operably coupled to the controller of the spray system via at least one HAT board of a plurality of HAT boards coupled to the controller.

16. The method of claim 15, comprising:
detecting, via the processor, the HAT board of the plurality of HAT boards coupled to the controller; and
installing the first software driver and the second software driver in a memory of the controller.

17. The method of claim 12, comprising:
detecting, via the processor, a discrete input/output (I/O) HAT board coupled to the controller, wherein the discrete I/O HAT board is configured to couple to one or more sensors, one or more valves, or a combination thereof; and
installing corresponding software drivers in a memory of the controller based on the one or more sensors, the one or more valves, or a combination thereof, configured to couple to the discrete I/O HAT board.

18. The method of claim 17, comprising initializing, via the processor, the corresponding software drivers from the memory of the controller based on the one or more sensors, the one or more valves, or a combination thereof, coupled to the discrete I/O HAT board.

19. The method of claim 12, comprising:
detecting, via the processor, a smart internet-of-things (IOT) HAT board coupled to the controller, wherein the smart IOT HAT board is configured to receive data related to the spray system; and determining the first operation of the first spray applicator and the second operation of the second spray applicator based on the data received by the smart IOT HAT board.

20. The method of claim 12, wherein the first spray applicator and the second spray applicator are wirelessly detected via the processor, and wherein the first operation of the first spray applicator and the second operation of the second spray applicator are wirelessly controlled.

* * * * *